United States Patent [19]

Kuhn, Jr. et al.

[11] 3,890,580

[45] June 17, 1975

[54] TWO PHASE OSCILLATOR

[75] Inventors: Harry A. Kuhn, Jr., Phoenix, Ariz.; Donald D. Schendel, Jr., North Palm Beach, Fla.

[73] Assignee: Motorola, Inc., Chicago, Ill.

[22] Filed: Dec. 27, 1973

[21] Appl. No.: 428,932

[52] U.S. Cl. .............................. 331/116 R; 331/159

[51] Int. Cl. .............................................. H03b 5/36

[58] Field of Search ........ 331/108 C, 108 D, 116 R, 331/114, 159, 168

[56] References Cited

UNITED STATES PATENTS

| | | | |
|---|---|---|---|
| 1,914,120 | 6/1933 | Hagen | 331/159 |
| 2,106,821 | 2/1938 | Tunick | 331/159 |
| 2,137,687 | 11/1938 | Hansell | 331/159 |
| 2,494,321 | 1/1950 | Usselman | 331/159 |
| 2,718,593 | 9/1955 | Felix | 331/159 |
| 3,356,963 | 12/1967 | Buck | 331/168 |
| 3,581,235 | 5/1971 | Siu | 331/159 |
| 3,585,526 | 6/1971 | Zelinka | 331/116 |
| 3,609,592 | 9/1971 | Raval | 331/116 |

*Primary Examiner*—John Kominski

*Attorney, Agent, or Firm*—Vincent J. Rauner; Willis E. Higgins

[57] ABSTRACT

A crystal controlled oscillator providing two symmetrical out-of-phase outputs utilizes two silicon gate CMOS (complementary metal oxide silicon) field-effect transistor inverter circuits with the frequency determining crystal connected across the inputs to the two inverters. The outputs of the two inverters are cross-coupled to the inputs to sustain oscillation, and the circuit provides stable crystal control of both of the output phases with excellent load isolation.

9 Claims, 3 Drawing Figures

TWO PHASE OSCILLATOR

BACKGROUND OF THE INVENTION

Oscillators producing squarewave output signals generally are relaxation oscillators in which the frequency is primarily determined by resistance-capacitance networks and the DC supply voltage. The frequency of operation of such oscillators, however, is very sensitive to environmental conditions, such as ambient temperature and variations in the supply voltage. Because of this, relaxation oscillators are not suitable for applications where very stable frequencies of oscillation are required. In addition, these oscillators are difficult to fabricate as monolithic integrated circuits because of the relatively close tolerances imposed on the magnitudes of the resistors and capacitors to produce the desired predetermined frequencies of operation.

A crystal controlled squarewave oscillator using a complementary metal oxide silicon (CMOS) field-effect transistor inverter stage as the active circuit component has been designed and is disclosed in the patent to Fuad Musa U.S. Pat. No. 3,676,801, issued July 11, 1972 and assigned to the same assignee as the present invention. The circuit of the Musa patent produces a single squarewave output, and further disclosure is made in that patent of a configuration which provides complementary outputs (two phase outputs). These outputs, however, are not exactly 180° out of phase since there is some additional phase delay between the two outputs because of the oscillator configuration. In addition, the crystal, which controls the frequency of operation of the oscillator, is coupled in a path between the output and input terminals of the CMOS inverter stage, which imposes some restrictions on the loads which can be driven by the oscillator to avoid adversely affecting the frequency of operation.

SUMMARY OF THE INVENTION

It is an object of this invention to provide an improved two phase oscillator circuit.

It is another object of this invention to use complementary metal oxide silicon field-effect transistors (CMOS FET's) as the active components in an oscillator which produces complementary squarewave output signals.

It is a further object of this invention to isolate the frequency determining crystal of a CMOS squarewave oscillator circuit from the output terminals of the oscillator.

An additional object of this invention is to produce a two phase crystal controlled oscillator which can be fabricated in monolithic integrated circuit form with the exception of the crystal.

In accordance with a preferred embodiment of this invention, two complementary metal oxide silicon (CMOS) field-effect transistor inverter stages are employed as the active components of an oscillator. A crystal for determining the frequency of operation of the oscillator is connected across the inputs of the two inverter stages. The output of each of these inverter stages is cross-coupled to the input of the other through a feedback capacitor which provides isolation of the crystal from the loads due to the high reactance of the feedback coupling capacitors. The operation is such as to produce two output waveforms, one at the output of each of the inverters, which are of the same frequency but of opposite phases. Due to the push-pull or parallel nature of the circuit configuration, there is no phase delay between these two outputs, and because of the CMOS circuit configuration, the oscillator operates with very low power dissipation.

DETAILED DESCRIPTION

Figure 1:
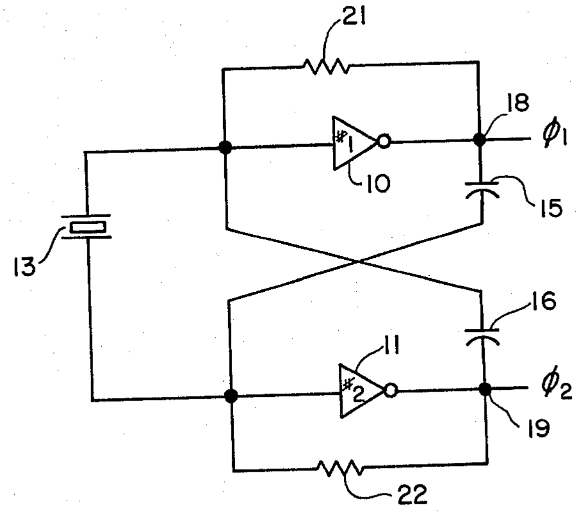
FIG. 1 is a simplified circuit diagram of a preferred embodiment of the invention.

In the drawing, the same reference numerals are used throughout the Figures to identify the same or similar components.

Referring now to FIG. 1, there is shown the basic circuit for a two phase crystal controlled oscillator capable of producing two symmetrical output signals 180° out of phase at low circuit power demands. The active elements of the oscillator circuit shown in FIG. 1 are a pair of inverter circuits 10 and 11, which preferably are constructed as complementary metal oxide silicon field-effect transistor integrated circuits (CMOS circuits). These can be either silicon gate or metal gate inverter circuits.

A crystal 13 is connected across the inputs to the inverters 10 and 11 to establish the frequency of oscillation of the circuit. The crystal 13 can have any value well known in the prior art and is operated in a parallel resonance mode of operation between the two inputs. The crystal 13 self-starts into resonance upon the application of power to the circuit. Initially, for one or two cycles, until the crystal reaches its resonant frequency of oscillation, the oscillator may produce unsymmetrical output signals. After this initial start-up, however, the operation is a symmetrical operation determined by the characteristics of the crystal and a pair of feedback capacitors 15 and 16 cross-connected from the outputs of the inverters 10 and 11 to their inputs.

To insure production of symmetrical squarewave signals on both of the output terminals 18 and 19, both of the capacitors 15 and 16 should have the same value. This value is determined by the frequency of operation of the circuit, which in turn determines how much impedance the capacitors offer, and the amount of feedback and isolation of the crystal from the output terminals that is desired. The smaller the value of capacitance used for the capacitors 15 and 16, the greater is the isolation of the crystal 13 from the output terminals 18 and 19. For smaller value capacitance, however, there is less feedback; so that it then is necessary to have greater gain in the inverter amplifiers 10 and 11. The value which is finally selected necessarily is a tradeoff between the isolation desired for the crystal element 13 and the gain of the inverter stages 10 and 11.

The circuit of FIG. 1 also includes a pair of resistors 21 and 22 connected from the output terminals 18 and 19 to the respective input terminals of the inverter amplifiers 10 and 11 to operate as self-biasing branches for the circuit. These resistors 21 and 22 establish a center quiescent operating point for each of the inverter circuits 10 and 11. The values of these resistors are non-critical and a value in the range between 1 megohm and 10 megohms is typical. This large resistance, of course, serves to insure the isolation of the crystal 13 from the load output terminals 18 and 19.

Figure 3:
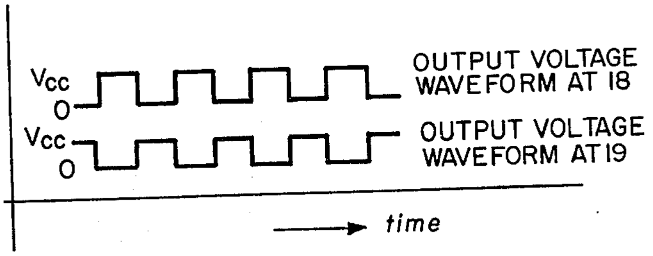
FIG. 3 illustrates the output waveforms obtained from the circuits shown in FIGS. 1 and 2.

FIG. 3 shows the waveforms which are obtained on the two output terminals 18 and 19, respectively. It can be seen that two squarewave symmetrical signals are produced 180° out of phase, and each of these output signals can be separately utilized.

Figure 2:
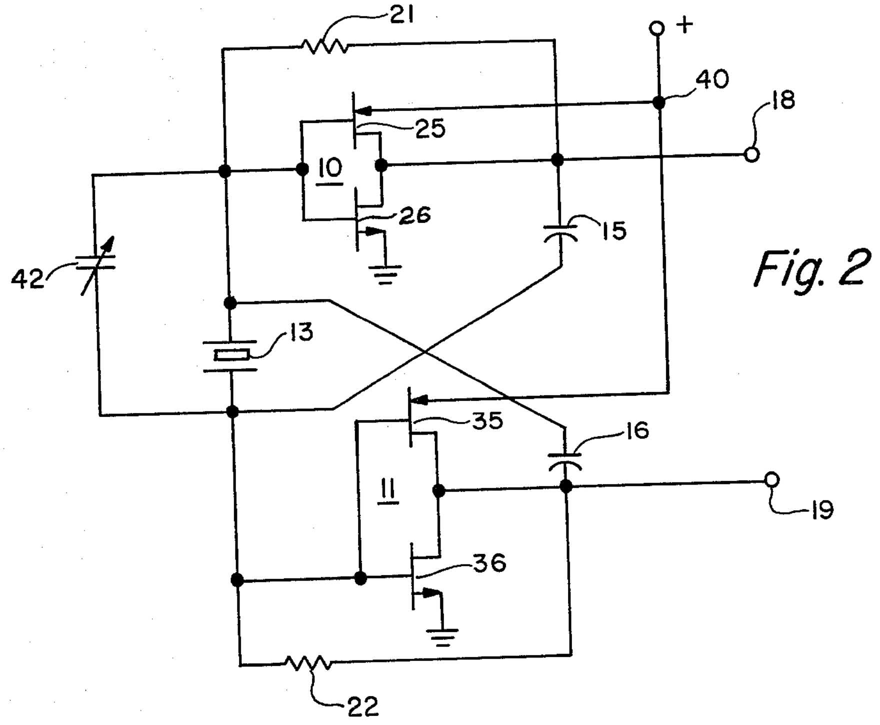
FIG. 2 is a detailed circuit diagram of the circuit shown in FIG. 1.

Referring now to FIG. 2, the circuit of FIG. 1 is shown constructed in a form which can be easily integrated as a monolithic integrated circuit using silicon gate field-effect transistors. In this form, the two inverter circuits 10 and 11 are constructed as a CMOS structure with the inverter 10 including a P-channel field-effect transistor 25 and an N-channel transistor 26. The inverter 11 includes a P-channel field-effect transistor 35 and an N-channel field-effect transistor 36. The two transistors of each of the inverters 10 and 11 have their drains interconnected at a common output point which constitutes the output terminal for the respective inverter in which they are used. Similarly, the gates of the two transistors of each of the inverters 10 and 11 are interconnected to a common input terminal across which the crystal 13 is connected.

As shown in FIG. 2, the sources of the transistors 25 and 35 are connected to a voltage supply terminal 40 which in turn is coupled to a source of positive direct current potential. The sources of the N-channel transistors 26 and 36 are connected to ground which comprises a second direct current voltage supply terminal for the circuit. The individual operation of the inverter circuits 10 and 11, shown in FIG. 2, is well known and is described in the Musa U.S. Pat. No. 3,676,801, mentioned above. Each of these inverter circuits operates as the basic gain block for the circuit and, in addition, provides the load driving capability for loads which may be attached to the two output terminals 18 and 19. The CMOS inverter circuits 10 and 11 exhibit very high input impedance and a low output impedance with excellent voltage gain.

The resistors 21 and 22 used for each of the two inverters 10 and 11, function as self-biasing branches for the inverters to establish centered quiescent operating points for each of the inverters. Since these resistors have very high values of resistance, they serve as very effective isolation for the crystal 13 from the loads connected to the output terminals 18 and 19.

The cross-coupling capacitors 15 and 16 are required to sustain oscillation in the circuit and feedback the output of the respective inverter stages 10 and 11 to the input of the opposite inverter. These capacitors preferably are of relatively small value; so that they can be integrated onto an integrated circuit chip with the other elements of this circuit if desired. In fact, all of the circuit components described up to this point, can be formed on a single integrated circuit chip with the exception of the crystal 13, which must be located externally.

For oscillations to be sustained, it is necessary that one or both of the transistors 25, 26 or 35, 36 in each of the inverter amplifiers 10 and 11, must have a small signal gain at the desired frequency of operation in excess of unity. Typical values for the feedback capacitors 15 and 16 are in the range from 2 to 20 picofarads, with 10 picofarads considered suitable for use of the circuit as the basic frequency source for a watch or clock-driver circuit, or the like. Again, the exact value of the capacitors 15 and 16 depends upon the desired frequency of operation of the circuit, the amount of feedback which is required and the load isolation which is required for the crystal 13. The desired feedback is maximized across the crystal at the frequency of operation.

If desired, a variable trimmer capacitor 42 can be connected in parallel with the crystal 13 to capacitively pull the frequency of operation to a lower desired point of operation. In addition, if temperature compensation is required for the crystal 13, a temperature compensating capacitive element can be connected in series with the crystal 13 between the input terminals of the inverter amplifier stages 10 and 11.

The circuit which is shown in FIG. 2 is easily integrated with present state-of-the-art techniques. The circuit produces two symmetrical outputs which are 180° out of phase. They are produced simultaneously. The push-pull configuration of the circuit also minimizes the effects of parasitic voltage and temperature. Because of the CMOS configuration of the active components of the circuit, it has very low power dissipation. The circuit exhibits extremely good stability and load isolation from the crystal, which permits desirable flexibility in the use of the circuit with different loads.

What is claimed is:

1. A two phase oscillator circuit comprising complementary metal oxide silicon (CMOS) field-effect transistors including in combination:

first and second voltage supply terminals for connection to first and second levels, respectively, of direct current potential;

a first field-effect transistor of a first conductivity type, having source, drain and gate electrodes;

a second field-effect transistor of a second conductivity type, having source, drain and gate electrodes;

means interconnecting the drain electrodes of said first and second field-effect transistors to form a first output terminal;

means interconnecting the gate electrodes of said first and second field-effect transistors to form a first input terminal;

a third field-effect transistor of said first conductivity type, having source, drain and gate electrodes;

a fourth field-effect transistor of said second conductivity type, having source, drain and gate electrodes;

means interconnecting the drain electrodes of said third and fourth field-effect transistors to form a second output terminal;

means interconnecting the gate electrodes of said third and fourth field-effect transistors to form a second input terminal;

frequency determining circuit means coupled in circuit between said first and second input terminals;

a first feedback circuit coupling said first output terminal with said second input terminal;

a second feedback circuit coupling said second output terminal with said input terminal;

means coupling said source electrodes of said first and third field-effect transistors with said first voltage supply terminal; and means coupling the source electrodes of said second and fourth field-effect transistors with said second voltage supply terminal.

2. The combination according to claim 1 wherein said first conductivity type of field-effect transistors are P-channel field-effect transistors and said second conductivity type of field-effect transistors are N-channel field-effect transistors.

3. The combination according to claim 1 further including a first bias resistor coupled between said first input terminal and said first output terminal; and a second bias resistor coupled between said second input terminal and said second output terminal.

4. The combination according to claim 1 wherein said first and second feedback circuits comprise first and second capacitors, respectively.

5. The combination according to claim 1 wherein said frequency determining means includes a crystal for setting the frequency of operation of said oscillator.

6. A two phase oscillator comprising complementary metal oxide silicon (CMOS) field-effect transistors including in combination:

first and second voltage supply terminals for connection to first and second levels, respectively, of direct current potential;

a first field-effect transistor of a first conductivity type, having source, drain and gate electrodes;

a second field-effect transistor of a second conductivity type, having source, drain and gate electrodes;

means for interconnecting the drain electrodes of said first and second field-effect transistors to form a first output terminal;

means for interconnecting the gate electrodes of said first and second field-effect transistors to form a first input terminal;

a third field-effect transistor of said first conductivity type, with source, drain and gate electrodes;

a fourth field-effect transistor of said second conductivity type, with source, drain and gate electrodes;

means for interconnecting the drain electrodes of said third and fourth field-effect transistors to form a second output terminal;

means for interconnecting the gate electrodes of said third and fourth field-effect transistors to form a second input terminal;

a crystal connected between said first and second input terminals;

a first feedback capacitor connected between said first output terminal and said second input terminal;

a second feedback capacitor connected between said second output terminal and said first input terminal;

means for connecting the source electrodes of said first and third transistors with said first voltage supply terminal; and means for connecting the source electrodes of said second and fourth field-effect transistors with said second voltage supply terminal.

7. The combination according to claim 6 wherein said first and third field-effect transistors are P-channel field-effect transistors, said second and fourth field-effect transistors are N-channel field-effect transistors, and said first voltage supply terminal is adapted for connection to a direct current potential which is positive with respect to the direct current potential to which said second voltage supply terminal is adapted to be connected.

8. The combination according to claim 7 further including a first biasing resistor connected between said first input terminal and said first output terminal and a second biasing resistor connected between said second input terminal and said second output terminal.

9. The combination according to claim 8 further including a capacitor connected in parallel across said crystal for providing frequency trimming.

* * * * *